United States Patent
Aley et al.

(10) Patent No.: US 10,444,313 B2
(45) Date of Patent: Oct. 15, 2019

(54) MAGNETIC RESONANCE APPARATUS AND OPERATING METHOD WITH RECOGNITION AND AVOIDANCE OF EXCESSIVE EXCITATIONS IN AN INTERFERENCE SPECTRUM

(71) Applicant: Siemens Healthcare GmbH, Erlangen (DE)

(72) Inventors: Nicholas Aley, Erlangen (DE); Stephan Biber, Erlangen (DE); David Grodzki, Erlangen (DE); Marcel Kruip, Oxford (GB)

(73) Assignee: Siemens Healthcare GmbH, Erlangen (DE)

( * ) Notice: Subject to any disclaimer, the term of this patent is extended or adjusted under 35 U.S.C. 154(b) by 230 days.

(21) Appl. No.: 15/459,253

(22) Filed: Mar. 15, 2017

(65) Prior Publication Data
US 2017/0269181 A1  Sep. 21, 2017

(30) Foreign Application Priority Data
Mar. 16, 2016 (DE) .......................... 10 2016 204 376

(51) Int. Cl.
*G01R 33/56* (2006.01)
*G01R 33/38* (2006.01)
*G01R 33/3815* (2006.01)

(52) U.S. Cl.
CPC ..... *G01R 33/5607* (2013.01); *G01R 33/3804* (2013.01); *G01R 33/3815* (2013.01)

(58) Field of Classification Search
CPC ............ G01R 33/5607; G01R 33/3804; G01R 33/3815
See application file for complete search history.

(56) References Cited

U.S. PATENT DOCUMENTS

| | | |
|---|---|---|
| 6,407,548 B1 | 6/2002 | Dietz |
| 9,194,926 B2 * | 11/2015 | Dietz ..................... G01R 33/54 |
| 2013/0275086 A1 | 10/2013 | Grodzki et al. |
| 2015/0369889 A1 | 12/2015 | Grodzki |
| 2017/0205483 A1 | 7/2017 | Feiweier et al. |

* cited by examiner

*Primary Examiner* — Susan S Lee
(74) *Attorney, Agent, or Firm* — Schiff Hardin LLP

(57) ABSTRACT

In a magnetic resonance apparatus and an operating method therefor, at least one limitation criterion, which describes the avoidance of excessive excitations in an interference spectrum in the magnetic resonance scanner of the apparatus, formed by an interference frequency or an interference frequency range, is specified by a limitation supply processor in order to check a scanning protocol, described by recording parameters, that is to be implemented. At least part of the temporal control sequence of the scanning protocol is determined as a pre-calculation sequence from the recording parameters by a simulation processor and the pre-calculation sequence is checked in a checking processor by the limitation criterion. Implementation of the scanning protocol is prevented when the limitation criterion is not fulfilled.

24 Claims, 4 Drawing Sheets

FIG 5

MAGNETIC RESONANCE APPARATUS AND OPERATING METHOD WITH RECOGNITION AND AVOIDANCE OF EXCESSIVE EXCITATIONS IN AN INTERFERENCE SPECTRUM

BACKGROUND OF THE INVENTION

Field of the Invention

The invention concerns a method for operating a magnetic resonance apparatus for checking a scanning protocol, described by recording parameters, that is to be implemented. The invention also concerns a magnetic resonance apparatus and an electronically readable data storage medium that implement such a method.

Description of the Prior Art

Magnetic resonance imaging (MRI) is a widely known imaging modality and is frequently used when examining medical issues. Magnetic resonance imaging uses a strong magnetic field, for example of 1.5 tesla or 3 tesla, so nuclear spins in a subject orient themselves along this basic magnetic field (B0). These uniformly aligned nuclear spins are excited by radio-frequency pulses and the decay of this excitation can be measured. To be able to allocate measured magnetic resonance signals to a location, magnetic gradient fields are used that are generated by appropriate gradient coils of a magnetic resonance scanner. The gradient coil arrangement is conventionally arranged inside an opening or tunnel through the basic field magnet in the scanner, into which the patient is moved in order to implement a patient scan.

During the scan, the gradient fields must be switched and changed extremely quickly using what are known as gradient pulses. Different frequencies can be generated by the physical gradient axes of the gradient coils of the gradient coil arrangement as a function of the scanning sequence that is used, recording parameters, and forms of the gradient pulses in the time domain. The spectral distribution of the corresponding frequencies has no effect on the hardware of the magnetic resonance scanner. Particular frequency bands can excite acoustic resonances and therefore lead to increased noise in the magnetic resonance scanner. Furthermore, strong gradients in particular frequency bands can also lead to increased interaction between the gradient coil arrangement and the basic field magnet. These excitations can lead to increased heating inside the basic field magnet, which can cause a coolant, in particular helium, used for cooling the basic field magnet to evaporate, or greater cooling can be needed in order to avoid a quench. Frequencies of this kind, which can lead to undesirable, interfering effects in the magnetic resonance scanner, will be called interference frequencies hereinafter, and these can also lie in interference frequency bands.

It would be possible for interference frequencies of this kind to be prohibited outright, and be taken into account in the design of scanning protocols or in the design of individual scanning sequences such that they do not occur. Such an approach, however, would severely limit the freedom of definition of scanning protocols and scanning sequences. Another approach would be to provide a passive frequency monitor that can be easily implemented as hardware in the magnetic resonance scanner, which monitors the excited frequencies during an ongoing magnetic resonance scan and stops the scan as soon as an excessive excitation of an interference frequency occurs. However, this does not prevent frequencies and scanning protocols, which lead to frequency errors, from being adjusted and started by a user. The scanning time of the magnetic resonance scan before stoppage is lost. If the frequency limitations for a particular magnetic resonance scanner tend to be minimal, then this would be a practicable solution, but this does not apply to many magnetic resonance scanners, so a passive frequency monitor of this kind severely impedes the workflow of the user and significantly increases total scanning times.

A further problem for the user is that the behavior of the magnetic resonance scanner is not predictable when a passive frequency monitor is used or with basic exclusion of the interference frequencies. Even for developers of scanning protocols and scanning sequences it is nearly impossible to estimate the frequency distribution, particularly due to the gradient pulses, during a magnetic resonance scan. The end result is therefore a highly non-linear, unpredictable, and unanalytical behavior of recording parameters with regard to their availability or suitability for a particular sequence.

A further problem can result from the fact that the physical gradient axes specified by the gradient coils of the gradient coil arrangement are not used in all scanning protocols and scanning sequences, wherein the latter conventionally form parts of a scanning protocol or an overall magnetic resonance sequence. Instead, gradient directions oriented in some other way may be used under some circumstances for slice selection gradients, phase-coding gradients and/or readout gradients. In other words, a gradient coil arrangement conventionally has three gradient coils, which can generate gradient fields in three physical gradient directions (conventionally x, y, z) that are perpendicular to each other. By appropriate control of the gradient coils and overlaying of the generated gradient fields, however, it is also possible to use different gradient directions compared to the physical gradient directions. These are conventionally called logical gradient directions or gradient axes. Within the context of the present invention this means that it is easily possible for scanning protocols to be operable in some orientations of the gradient directions without excessive excitations in the case of interference frequencies, while problems can occur with a rotation of these logical gradient directions.

With respect to other limitations of conventional magnetic resonance apparatuses, it has been proposed in subsequently published DE 10 2016 200 549.9 to supply at least one limitation by a limitation supply unit and to supply a number of parameters of the sequence by a parameter supply unit, wherein a pre-set parameter value is associated with at least one, ideally each, of the multiple parameters. Also in this procedure, one of the multiple parameters is selected by a selection unit, and a simulation unit determines at least one sequence progression using at least one of the pre-set parameter values. An evaluation unit then determines an admissible parameter value range of the selected parameter using the at least one sequence progression and using the at least one limitation, whereby a new parameter value is defined within the admissible parameter value range by a defining unit.

The device limitations, for example, can include a limitation dictated by the design of the magnetic resonance scanner with which the magnetic resonance tomography is to be carried out. The aforementioned subsequently published document refers, in particular, to a maximum gradient amplitude and/or a maximum slew rate, which can be generated by a gradient coil arrangement of the magnetic resonance scanner. An application limitation can also be used, namely a limitation that is dictated by an effect of the magnetic resonance scanner and/or an examination object, in particular a human or animal patient, due to implementation of a magnetic resonance sequence. It is possible, for example, that an application of excessive gradient amplitudes will affect physiological limits of the patient, such as peripheral nerves of the patient being excessively stimulated. Limitations can include a safety buffer to prevent that from happening. Frequency effects are not discussed in the subsequently published DE 10 2016 200 549.9.

SUMMARY OF THE INVENTION

An object of the invention is to enable early recognition and avoidance of excessive excitations in an interference spectrum that includes the above-described interference frequencies, in the operation of a magnetic resonance scanner.

In accordance with the invention, in a method for operating a magnetic resonance data acquisition scanner of a magnetic resonance apparatus, at least one limitation criterion that describes the avoidance of excessive excitations in an interference spectrum in the magnetic resonance scanner, formed by an interference frequency or an interference frequency range, is specified by a limitation supply processor in order to check a scanning protocol, described by recording parameters, that is to be implemented. At least part of the temporal control sequence of the scanning protocol is determined as a pre-calculation sequence from the recording parameters by a simulation processor, and the pre-calculation sequence is checked in a checking processor with respect to the limitation criterion. Implementation of the scanning protocol is prevented when the limitation criterion is not fulfilled.

The scanning protocol provides at least one scanning sequence, which is repeated at least once in each case to record (acquire) magnetic resonance data. When a scanning protocol of this kind is carried out for the magnetic resonance scan, ultimately the recording parameters are used in order to derive control parameters therefrom for the various components of the magnetic resonance scanner. This means that the recording parameters describe, in an encoded manner, which pulses will be possible in the actual magnetic resonance scan in order to implement the recording parameter in this way. In order to nevertheless be able to assess which frequency spectrum is affected by the resulting pulses, in particular gradient pulses, before the actual running time, a temporal control sequence of at least part of the scanning protocol is determined in accordance with the invention by a simulation processor. A control progression of this kind therefore describes a temporal sequence of scanning events, for example excitation pulses and/or gradient pulses and/or readout processes. Determining the temporal control sequence can include a temporal rolling-out of the scanning protocol, in particular a scanning sequence of the scanning protocol. For specific calculation of the temporal control sequence, analogously to DE 10 2016 200 549.9, a values table can be calculated, with the values table having a first column and a second column, with the first column including at least one time value and the second column at least one progression value associated with the at least one time value. A time value conventionally corresponds to a time of the control sequence, so the number of rows in the values table results from the number of times of the control sequence. The progression values are conventionally dependent on at least one of the values of the recording parameters.

At least for the gradient pulses of the physical gradient axes that are to be activated, it is advantageous to determine those gradient pulses during at least part of the scanning protocol, as the pre-calculation sequence. For example, possible progression values, as noted, can be gradient amplitudes that are to be generated by a physical gradient coil of the gradient coil arrangement, i.e. on the physical gradient axes. Correction gradients and/or compensation gradients, in particular eddy current compensation gradients, are preferably also taken into consideration here, so the pre-calculation sequence maps the actual use of the gradient coil arrangement. The gradient coil arrangement typically has three physical gradient axes, which can be called the x-, y- and z-axes. In the case of a magnetic resonance scanner having a cylindrical patient-receiving receptacle, the z-axis often corresponds to the cylinder axis of the patient-receiving receptacle. A vertical axis at right angles to the z-axis is often defined as the y-axis and a horizontal axis at right angles to the y-axis and z-axis is defined as the x-axis.

Logical gradient axes can be distinguished from the physical gradient axes. The logical gradient axes conventionally include a slice selection gradient axis, a phase-encoding gradient axis and/or a frequency-encoding gradient axis, which typically form a three-dimensional orthogonal coordinate system. The relative position of the logical gradient axes to the physical gradient axes conventionally defines the orientation of the scanning region, in particular a slice to be scanned.

A slice selection gradient is conventionally applied parallel to the slice selection gradient axis. With the use of slice selection gradient pulses, often also called slice selection gradients for short, atomic nuclei can be purposefully excited in a desired slice. Furthermore, phase-encoding gradient pulses, often also called phase-encoding gradients for short, are conventionally applied parallel to the phase-encoding gradient axis, and frequency-encoding gradient pulses, often also called frequency-encoding gradients for short, are applied parallel to the frequency-encoding gradient axis. Phase-coding gradients and frequency-encoding gradients typically enable spatial encoding of the magnetic resonance signals in the excited slice. The frequency-encoding gradient can also be called a readout gradient since it is conventionally applied at the same time as reading out of the magnetic resonance signals.

The logical gradient axes conventionally deviate from the physical gradient axes therefore, depending on orientation and/or tilting of the scanning region and/or scanning slice, so the gradient pulses of the logical gradient axes occur on the physical gradient axes at locations that are a function of the orientation and/or tilting of the scanning region and/or the scanning slice.

These gradient pulses that result for the physical gradient axes are therefore pre-calculated in the simulation unit for at least part of the scanning protocol.

In general, an active frequency monitor (AFM) thus is used according to the invention, which enables only the implementation of scanning protocols that do not exceed the limits, described by the limitation criterion, with respect to the interference frequencies. The active frequency monitor described herein includes the limitation supply processor, the simulation processor (which can also be called a roll-out processor) and the checking processor (evaluation processor), which can each be implemented by software and/or hardware. According to the invention, at least one representative part of the scanning protocol is therefore "rolled out" in a first step. This means the pre-calculation sequence is determined, wherein the contents of subsequently published DE 10 2016 200 549.9 can also be applied in this regard.

In a second step, a check is then made as to whether the limitation criterion is fulfilled by the pre-calculation sequence. If it is not fulfilled, excessive excitations would therefore exist in the case of at least one interference frequency when carrying out the scanning protocol, so implementation of the scanning protocol is prevented. This can be achieved by the prevention of input options, automatic adjustment, or simple blocking of the implementation, as will be described in more detail below.

In an embodiment of the present invention, for a scanning sequence that repeats itself, in particular on the basis of the gradients, a portion of the scanning protocol that includes the scanning sequence just once is pre-calculated as part of the scanning protocol. This means the pre-calculation sequence is based only on a representative part of the scanning protocol, which can represent just a very small part of the overall actual scanning process. The representative part is usually repeated many times in the actual scanning process, for example 20 to 1,000 times. In this context, it can be sufficient to limit the calculations of the simulation unit to this representative part, in particular the scanning sequence. The scanning sequence can be a partial sequence of a magnetic resonance sequence forming the entire scanning protocol. Computing capacities can be reduced in this way, particularly when it is essentially limited to just the gradient pulses that repeat themselves in an identical or at least comparable manner.

In a further embodiment of the present invention, in order to check the limitation criterion, a Fourier transform of the pre-calculation sequence is performed in the frequency domain and the inputs in the interference spectrum are evaluated. Thus the frequency spectrum, resulting from the pre-calculation sequence, and therefore the gradient pulses described therein, is determined by the gradient pulses of each physical axis (and optionally further considered pulses) being Fourier transformed. The inputs of the frequency spectrum, which relate to the interference spectrum of the interference frequencies, are then evaluated implicitly or explicitly.

It is particularly advantageous in this embodiment, in the case of a pre-calculation sequence that describes a scanning sequence, for the pre-calculation sequence to be repeatedly concatenated for a number of repetitions of the scanning sequence in the scanning protocol before the Fourier transform. This means that whenever only a representative portion of the scanning protocol is being considered, it can be expedient to "extrapolate", by successively switching the representative part (i.e. the pre-calculation sequence based on the scanning sequence) repeatedly several times before applying the Fourier transform, so in this way even the extremely low frequencies can be taken into consideration which could not otherwise be assessed.

One specific option for checking the limitation criterion is to integrate a product of a frequency spectrum of the pre-calculation sequence, which describes the power inputs at different frequencies, with a heating response function for a coolant, in particular helium, used for cooling a superconducting basic field magnet of the scanner. The integral result is compared with a threshold value. Additionally or alternatively, within the scope of the limitation criterion, individual energy inputs are compared with threshold values at frequencies of the interference spectrum. For each interference frequency/each interference frequency band, and optionally for each individual gradient axis as well, a check can be made as to whether the energy inputs, optionally described by the gradient strengths, do or do not exceed the permitted threshold values. In a preferred embodiment, however, the power frequency spectrum is multiplied by a heating response function for the coolant, such as helium, for cooling the superconducting magnet. A heating response function of this kind can be obtained, for example, in scans or by simulations and/or can be retrievably stored in a database. The resultant product is then integrated and checked using a threshold value. In this way the interference spectrum is therefore implicitly checked by heating inputs from various portions of the interference spectrum ultimately being summed using the response function, and it is jointly considered whether excessive heating of the helium occurs during the progression of the scanning protocol.

Reference information is preferably emitted as an output to a user when the limitation criterion is not fulfilled. It is preferred in this connection for an item of additional information to be added that describes the type of limitation transgression, so the reason for the non-feasibility of the scanning protocol is more evident to the user and he or she can optionally take targeted steps to eliminate the problem. In particular, an item of information relating to a step can also be included, as will be illustrated below.

In a preferred embodiment of the inventive method, a recording parameter responsible for non-fulfillment of the limitation criterion is identified and included in the output to a user and/or is automatically adjusted. The active frequency monitor described herein has been generally described as providing a type of Boolean variable (yes or no) as the result of the limitation criterion, but in this embodiment it also identifies and emits at least one recording parameter responsible for non-fulfillment of the limitation criterion and/or takes steps to cause the limitation to be satisfied.

For identification of the recording parameter, a time-specifying recording parameter is checked as to whether at least one natural number divided by the time-specifying recording parameter lies within the interference spectrum, or corresponds to a return frequency determined within the scope of checking the limitation criterion, for which frequency a permissible excitation strength is exceeded. According to the invention, it is preferred, in the case of non-fulfillment, for the limitation criterion to also supply at least one return frequency, which corresponds to the interference frequency, or to identify the interference frequency range in which the problem occurred that led to non-fulfillment of the limitation criterion. In other words, known background information, with which interference frequency problems occurred, is utilized further in this way in order to identify the responsible recording parameter. This makes it possible to use an algorithm by which a responsible recording parameter can be discovered that generates this interference frequency. All recording parameters relevant to the course of time are preferably checked for this purpose, as to whether they themselves, or one of their harmonics, induces the at least one return frequency. For example, for a recording parameter present as time t and/or a recording parameter that can be converted into a time t, a check can be made as to whether the following applies: $f=n/t$ (tolerance ranges can of course be taken into account here) for the return frequency f with respect to the harmonic n. Where a return frequency exists, the responsible recording parameter thus can be identified with little effort. It is also conceivable, however, to check all interference frequencies of the interference spectrum in this way when the limitation criterion fails, although this is less preferable.

If the improbable case should occur where no match with a return frequency is determined by checking the frequencies and their harmonics induced by a recording parameter, then, as a subsidiary possibility for identification of the recording parameter, other values can be successively assumed for each recording parameter and the fulfillment of the limitation criterion checked until a recording parameter is discovered to be responsible that, which when changed, causes the limitation criterion is fulfilled. This corresponds to a type of iterative variation of recording parameters relevant to the course of time until a valid solution is found.

This check can involve an echo time and/or a repetition time and/or an echo interval and/or slice number that determines an effective echo time and/or a number of concatenations of those items, as the responsible recording parameter. The most relevant parameters in this context are the echo time (TE) and the repetition time (TR), but further parameters may also have an effect, for example the echo interval in TSE sequences, slice numbers leading to a shorter, effective TR, and the number of concatenations ("Concats").

It is preferred to vary the responsible recording parameter within a specified adjustment interval to fulfill the limitation criterion, in order to automatically adjust and/or to emit reference information that contains a change notice to a user. A reliable value for the responsible recording parameter is therefore sought, in particular a value that causes a minimal change in the recording parameter. Known search techniques can be used here, and it is also possible to use background knowledge, for example the return frequency and/or an excitation strength associated with the return frequency, described for example by a gradient strength. If it has already been found, for example within the scope of identification of the responsible recording parameter, that the parameter excites an interference frequency in a particular harmonic, then it is frequently sufficient, at least when the interference frequency refers to a particular resonance, to make an extremely small change to the recording parameter, so the corresponding harmonic no longer affects the interference frequency or at least does not affect it with an excessive excitation strength. In other words, with knowledge of the return frequency, information, associated with the interference spectrum, about the individual interference frequencies can of course also be used as the resonance frequency, for example whether it is an interference frequency of a more extensive interference frequency band or a more intermittent interference frequency. For example, a new recording parameter can be determined such that the corresponding harmonic n attains the nearest target frequency fa allowed according to the interference spectrum, so the recording parameter, if it describes a time t, can therefore be determined as $t=n/fa$. It is preferred, however for an actual minimal adjustment to be determined by also taking into account an excitation strength produced by the limitation criterion in relation to the return frequency. For example, a frequency actually contained in the interference spectrum as an interference frequency is desired for which the excitation strength is still allowed according to the limitation criterion.

The result of an adjustment strategy of this kind can be provided to a user as reference information, for example in the following way "Your scanning protocol would run if TE is changed from 10.5 ms to 11.0 ms". A further aspect of the invention provides that particular specification intervals exist ("breathing ranges"), within which an automatic adjustment of the corresponding recording parameter can be made. A breathing range, which can be specified by a system designer and/or can be designed by a user so as to be adjustable, can provide that a recording parameter can be changed in a breathing range of 5-15%, in particular 10%, of the current value around the actual value. With this kind of automatic adjustment of the recording parameter, it is possible to avoid further user interactions and to convert the scanning protocol into an implementable variant.

It may occur that the responsible recording parameter may have been designated as unchangeable, in which as at least one further recording parameter affecting the excitation strength at the interference frequency leading to non-fulfillment of the limitation criterion is then varied in order to fulfill the limitation criterion. With different scanning protocols or magnetic resonance sequences, particular recording parameters, such as the echo time, must remain unchangeable. This is to ensure that an echo is measured in phase. In this case, the interfering maximum in the frequency spectrum must remain within the interference spectrum. It is then expedient, to lower the excitation strength, therefore the amplitude of the corresponding frequency peak in the frequency spectrum. According to this embodiment, this is achieved by the adjustment of further recording parameters that affect the excitation strength, with the recording parameters preferably also being adjusted here as a function of a return frequency returned by the limitation criterion and/or excitation strength at the return frequency. The amplitudes can be lowered as a whole or other parameters extended, for example by an adjustment of the repetition time and/or a reduction in the bandwidth. It is also possible for the slew rates of affected gradient coils to be reduced.

It should be noted the fact that even when determining further recording parameters to be changed in order to fulfill the limitation criterion, an automatic adjustment can be made within a breathing range, and a corresponding change notice is emitted in reference information, as an additional item of information.

The scanning protocol can be checked within the scope of a user entry of the recording parameters via a user interface. This means the inventive analysis with respect to the interference frequencies can be used as early as in the stage in which the scanning protocol is defined. For example, various scanning protocols can be prevented from being implemented by adjustment options of particular time-relevant recording parameters being limited as soon as a user selects the corresponding recording parameter for adjustment, for example by clicking on a corresponding input field in the user interface or the like. Although the procedure described in subsequently published DE 10 2016 200 549.9 can continue to be used here, it should be noted that a convex recording parameter characteristic cannot be assumed. Therefore, it is not sufficient to check only outer limits.

In a further embodiment of the invention, values for recording parameters that cannot be adjusted in the user interface are determined by checking the limitation criterion for test values of the recording parameter. The adjustability for the test values, for which the limitation criterion is not fulfilled, then is suppressed in the user interface. While it is basically conceivable to check every possible value of the recording parameter between a minimum and a maximum with respect to the limitation criterion, this would be extremely time-consuming and therefore not practicable. Therefore, in a preferred embodiment of the invention, the test values are determined as a function of the interference spectrum as interference frequencies potentially contained in the interference spectrum. In this way the number of values for the recording parameter to be checked can be minimized. Only the regions or values of a recording parameter that could excite an interference frequency should be checked, with the harmonics also being considered. For example, for the repetition time TR only those TR values should be checked which could affect an interference frequency $fs=n/TR$. This means, for example for an interference frequency of 500 Hz, that TR values of 2 ms, 4 ms, 6 ms, . . . must be checked. The effort can be significantly reduced in this way.

As noted, the content of DE 10 2016 200 549.9 is applicable to values of recording parameters that can be adjusted in a user interface. In particular, default values or already adjusted values are adopted for the other recording parameters if a particular recording parameter is selected for adjustment, for which adjustment options are to be determined. In this way the inventive method ensures that problems due to infringements of limitations are avoided even with respect to interference frequencies.

The inventive method can also be used outside of user interfaces. For example, the scanning protocol to be checked may be a scanning protocol transmitted from another magnetic resonance apparatus via an importation processor and/or may be a scanning protocol that has already been adjusted in terms of its gradient orientation. Many users want to use scanning protocols, which are used on other magnetic resonance apparatuses, on their own or another magnetic resonance apparatus as well, so they can be loaded, for example by an importation processor, into the controller of the user's apparatus. However, it is not clear in advance whether limitations with respect to interference frequencies will be transgressed, so this is now checked within the scope of the inventive method. The same applies if the orientation of the gradients is changed, consequently logical gradient axes are re-defined with respect to the physical gradient axes. Even then changes with respect to limitations can occur, and this can be found by the checking processor in accordance with the invention.

As noted, in a preferred development of the inventive method at least one further limitation criterion, which is not based on the interference spectrum, can be used. For example, the device limitations and application limitations mentioned within the scope of DE 10 2016 200 549.9 can also be incorporated, particularly with respect to limitations during operation of the gradient coil arrangement and SAR stress on the patient. In other words, the inventive method can therefore be particularly expediently embedded in other monitoring systems of a magnetic resonance apparatus, for example safety monitors (SAR monitoring, gradient stimulation monitoring and/or acoustic monitoring) and component monitors (overvoltage in the case of simultaneous transmission, charge balance models, gradient coil heating models, time constants of the GPA, . . . ). Embedding of the inventive method in these existing resources means that the inventive method is carried out in series or parallel with the designated tasks performed by those resources, or at least by a defined interface from the resource to the checking processor. A final permissibility check of all boundary conditions of safety and component monitors, also with respect to the interference frequencies, can be combined so as to ensure that, in the case of a scanning protocol, this protocol is consistent with all boundary conditions of the magnetic resonance apparatus. For example, the active frequency monitor described herein can prevent a recording parameter from being set to a value that would not be permissible with respect to an SAR monitor.

In a further embodiment of the invention, at least one of the at least one limitation criteria also evaluates a status parameter that describes the status of the magnetic resonance scanner, in particular a temperature of the magnetic resonance scanner. This embodiment is based on the knowledge that in particular states of the magnetic resonance scanner, excitations of greater excitation strength can optionally be permitted at the interference frequencies, or even with respect to limitation criteria not based on the interference spectrum, than in other states. One example of this is the temperature of the magnetic resonance scanner. When the magnetic resonance scanner is first used for magnetic resonance scans, for example in the morning, it is only slightly warm from use, so, for example, with excitations at interference frequencies that trigger evaporation of coolant, a greater buffer exists. Greater excitation strengths can consequently still be permitted than in the evening when the magnetic resonance scanner has already been heated significantly as a result of its continuous operation. The consideration of temperature states is also possible.

The present invention also concerns a magnetic resonance apparatus, having a controller (computer) designed to operate the scanner of the apparatus in order to carry out the inventive method. The controller therefore includes at least the limitation supply processor, the simulation processor and the checking processor. An input unit can also be provided for implementing a user interface. Further functional components, which can be associated with particular steps of the inventive method, are also conceivable, for example an adjustment processor for automatic adjustment of recording parameters, an output unit for presenting reference information and the like. All statements with regard to the inventive method apply to the inventive magnetic resonance apparatus, so the advantages already mentioned can also be obtained with the apparatus.

The invention also concerns a non-transitory, computer-readable data storage medium encoded with programming instructions (code) that cause the inventive method to be implemented. The code is executed by a controller of a magnetic resonance apparatus. The storage medium can be loaded directly into a memory of the controller of the magnetic resonance apparatus. The code can be a source code, which has still to be compiled and linked, or which only has to be interpreted, or an executable software code which for execution just has to be loaded in the memory of the controller of the magnetic resonance apparatus. The inventive method can thereby be carried out quickly, robustly and in a way that can be repeated in an identical manner. The controller accordingly has a working memory, an appropriate graphics card and/or an appropriate processor that efficiently enable implementation of the respective method steps. The electronically readable control information stored thereon is preferably a non-transient data carrier, for example a DVD, CD-ROM or the like.

DESCRIPTION OF THE PREFERRED EMBODIMENTS

Figure 1:
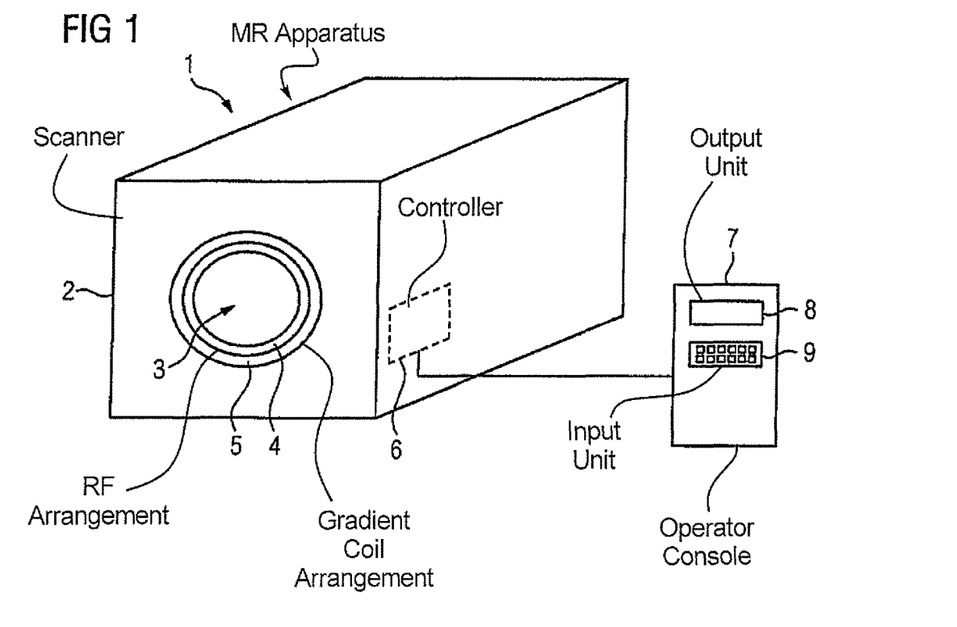
FIG. 1 shows an inventive magnetic resonance apparatus.

FIG. 1 is a schematic illustration of an inventive magnetic resonance apparatus 1. This has a scanner 2 in which the superconducting basic field magnet is situated that is cooled by a coolant, such as helium. A bore in the scanner 2 defines a patient receptacle 3, which is surrounded by a radio-frequency arrangement 4, and a gradient coil arrangement 5 having three gradient coils. The gradient coils are each associated with a physical gradient axis, so as to generate a gradient field in the direction of the associated physical gradient axis when a gradient current is provided thereto. Gradient fields can also be generated in further directions, i.e. along logical gradient axes, by overlaying gradient fields of different gradient coils of the gradient coil arrangement 5.

Operation of the magnetic resonance apparatus 1, in particular the scanner 2, is controlled by a controller 6, which is a computer designed for carrying out the inventive method. The controller 6 is connected to an operator console 7 of the magnetic resonance apparatus 1 and can be located outside of a shielded room surrounding the scanner 2. The operator console 7 has an output unit 8 and input unit 9. A user interface can be implemented by these units and can be used, for example, for entering recording parameters for a scanning protocol having at least one magnetic resonance sequence. Reference information can be presented via the output unit 8. The output unit 8 can be implemented by a display screen. The input unit 9 can include a keyboard and/or a mouse and optionally further input components.

Figure 2:
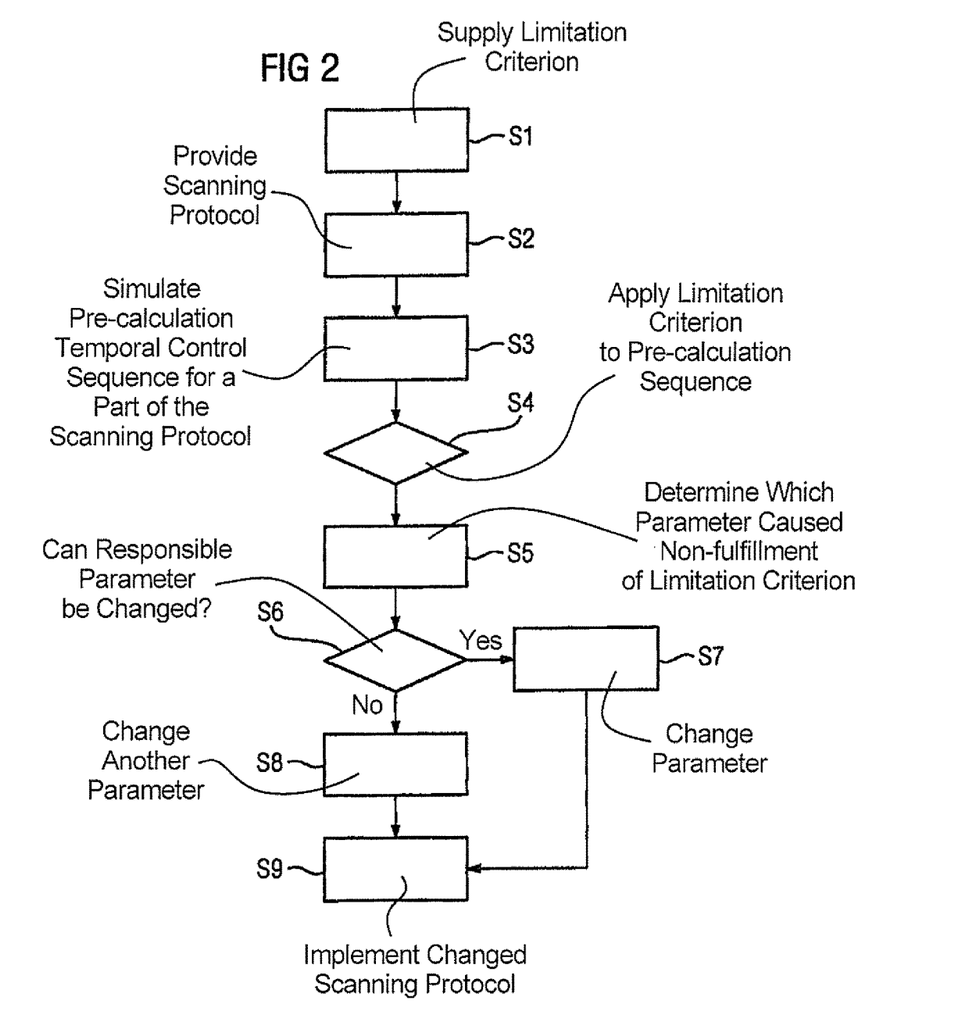
FIG. 2 is a flowchart of an exemplary embodiment of the inventive method.

FIG. 2 shows a flowchart of a first exemplary embodiment of the inventive method. This is used to check whether a scanning protocol described by recording parameters fulfills limitations described by a limitation criterion in respect of interference frequencies, in other words, in particular excessive acoustic effects, excessive effects disrupting the scan and/or excessive evaporation effects of the helium are prevented. The method implements an active frequency monitor and can be embedded in further monitoring methods, in particular those having a safety monitor and/or a component monitor.

In a step S1 the limitation criterion is supplied by a limitation supply processor. The limitation criterion describes how strong excitations can be with interference frequencies pertaining to an interference spectrum, so the scanning protocol can still be executed on the magnetic resonance device 1.

In a step S2 a complete scanning protocol, described by recording parameters, is already provided in this exemplary embodiment. This can be, for example, an imported scanning protocol supplied by an importation unit and retrieved by another magnetic resonance apparatus or a server for storing scanning protocols of other magnetic resonance apparatuses; it is also conceivable that the logical gradient axes of a scanning protocol that was previously used have been changed, for example by rotation, so a check is necessary as to whether the scanning protocol changed in this way also excites excessively when there are no interference frequencies.

In a step S3 at least part of the temporal control sequence of the scanning protocol is determined by a simulation processor from at least some of the recording parameters of the scanning protocol, and this shall hereinafter be called the pre-calculation sequence. Since in the present case it is primarily the effects of gradient pulses that are to be considered, the pre-calculation sequence includes the gradient pulses of the physical gradient axes to be activated, i.e. the gradient coils that are actually present in the gradient coil arrangement 5. Furthermore, it should be noted that the pre-calculation sequence is determined for only a representative repetitive part of the scanning protocol in which the gradient pulses essentially repeat themselves. This representative part shall be called a scanning sequence hereinafter.

In a step S4 the limitation criterion is then applied to the pre-calculation sequence. For this purpose, first a Fourier transform is applied to a pre-calculation sequence repeated for a particular number, with the number resulting as the number of repetitions of the representative part, i.e. the scanning sequence, within the scanning protocol. In this way a frequency spectrum is produced from which the strength of excitations for the various frequencies that occur can be read.

The limitation criterion carries out two types of evaluation of this frequency spectrum below. Firstly, for interference frequencies included in the interference spectrum a check is made as to whether the respective excitation strength described by the frequency spectrum exceeds a respective threshold value which can also be dependent on the respective interference frequency or the respective interference frequency range. If the threshold value is exceeded by the excitation strength, the limitation criterion is not fulfilled and in addition to a designation of this fact it also returns the information about the affected interference frequencies (hereinafter called at least one return frequency) and the excitation strengths associated with the individual return frequencies, described, for example, by a gradient strength.

In addition, a mathematical representation of the frequency spectrum of the pre-calculation sequence, which describes the power inputs at different frequencies, is multiplied by a heating response function for the helium used for cooling the main magnet. An integral of this product is formed, with the integral result being compared with a further threshold value. Furthermore, by analyzing the organ it may also be determined for which interference frequency or interference frequency range the primary heat contribution, which leads to the threshold value being exceeded, occurs. It is also possible in this case to provide this interference frequency or interference frequency range as return frequencies in the case of a failed limitation criterion. This second check is intended to prevent excessive heating and therefore excessive evaporation of helium during the scanning protocol.

The scanning protocol can be used if the limitation criterion is fulfilled in step S4. This is not shown. What is shown is the continuation of the method in step S5 in the case in which the limitation criterion was not fulfilled in step S4.

In a step S5 the process is then begun to determine which recording parameter is responsible for non-fulfillment of the limitation criterion. For this purpose, it is provided in step S5 that a check is made for a recording parameter that indicates or describes a time and which is to be checked as to whether the frequency resulting from the time, or its harmonic, corresponds to the return frequency determined within the scope of checking the limitation criterion. Of course a number of return frequencies can of course also occur in this connection. The following, for example, can be checked as the recording parameter: an echo time, a repetition time, an echo interval, a slice number determining an effective echo time and/or a number of concatenations. If, therefore, it is to be determined whether the repetition time TR is the responsible recording parameter, a check made as to whether $fr=n/TR$ applies, where n is a natural number and fr describes one of the at least one return frequencies. As a subsidiary, recording parameters which are time-relevant can be iteratively changed until the limitation criterion is fulfilled and the responsible recording parameter is found.

Figure 3:
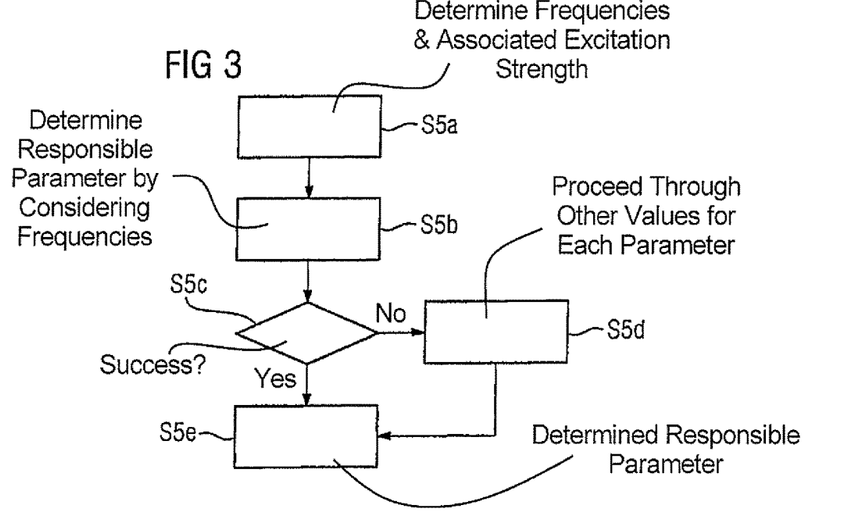
FIG. 3 is a flowchart of a sub-step of the exemplary embodiment according to FIG. 2.

This can be seen more precisely, moreover, from FIG. 3 which shows sub-steps of step S5. In step S5a the at least one return frequency and the associated excitation strength is determined, in particular still within the checking of the limitation criterion. Step S5b relates to the determination of the responsible recording parameter just discussed, by consideration of the frequencies induced by the time described by the recording parameter to be checked and the harmonics of the frequencies. A check made in step S5c as to whether this procedure has led to success. If this is not the case other values are successively assumed in step S5d for each recording parameter as a subsidiary possibility for identification of the recording parameter and the fulfillment of the limitation criterion checked until a recording parameter is discovered to be responsible which when changed means that the limitation criterion is fulfilled. In each case a responsible recording parameter is then present in step S5e.

In step S6, cf. FIG. 2 again, a check is then made as to whether the responsible recording parameter can be changed. If so, the method continues with step S7, in that, within a default interval, for example 10% of the current value of the recording parameter around the current value of the recording parameter, a new value of the responsible recording parameter can be discovered at which the limitation criterion is fulfilled. The return information of the limitation criterion can, in turn, expediently be used for more efficient calculation, in particular the return frequency and the excitation strength therefore.

Otherwise, if the responsible recording parameter cannot be changed, for example in order to be able to scan magnetic resonance signals in phase at the echo time (TE), an attempt is then made in step S8 to attain the excitation strength by adjustment/variation of further recording parameters, which affect precisely this excitation strength. Amplitudes, for example, can be reduced completely here and/or slew rates at the gradient coils can be reduced.

Finally, when an automatic adjustment is set, this is carried out in step S9, and the accordingly changed scanning protocol can be implemented since it fulfills the limitation criterion. In addition or alternatively, information on the adjustment of the recording parameters can be output, so a manual change can be made by the user accordingly in the case of an alternative output. Reference should be made generally to the fact that in the case of failed checking of the limitation criterion, reference information of this kind can also include information on the return frequency and optionally excitation strength at the return frequency in order to inform a user more extensively. Reference information is presented in any case if it was not possible in the steps S7 and S8 to discover a suitable value of the at least one recording parameter, i.e. the responsible recording parameter or at least one further recording parameter, within the at least one default interval.

Figure 4:
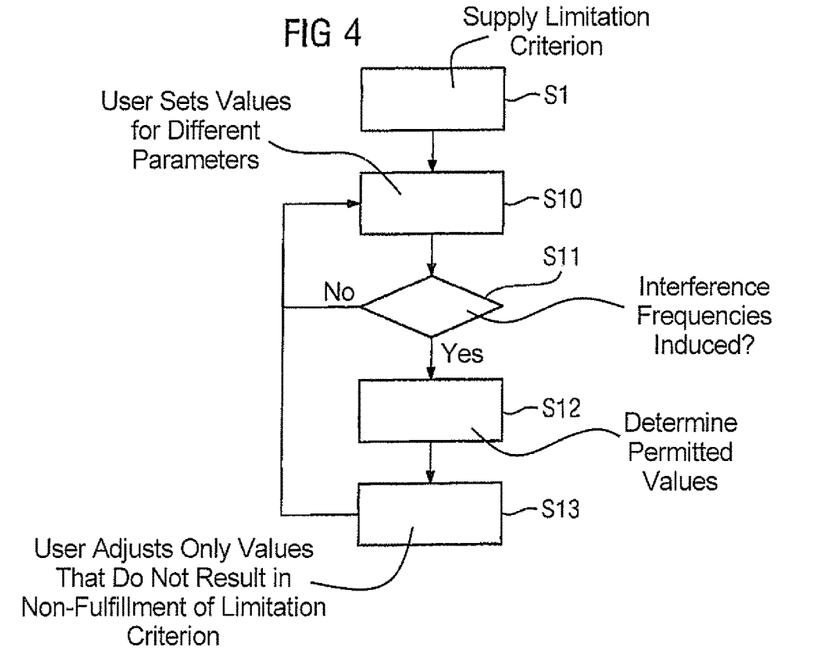
FIG. 4 is a flowchart of a further exemplary embodiment of the inventive method.

FIG. 4 shows a further exemplary embodiment of the inventive method which can be applied during an input procedure for recording parameters of a scanning protocol at a user interface of the magnetic resonance device 1.

The limitation criterion is again supplied in a step S1 by the limitation supply processor. In a step S10 the user can set values for different recording parameters in the user interface. A check is made in step S11 as to whether this is a recording parameter relevant as a function of time which could therefore trigger the inducing of interference frequencies, for example one of the examples mentioned above. If this kind of recording parameter for the setting has been selected by means of an input unit, for example the echo time or the repetition time, permitted values for this recording parameter are determined in step S12. For this, steps S3 and S4, already discussed with respect to FIG. 2 are carried out for the otherwise set/preset recording parameters and a test value of the recording parameter currently being considered, with the test values being chosen in the present case because the test values are excitingly determined as a function of the interference spectrum as interference frequencies potentially contained in the interference spectrum.

Test values of this kind result with recording parameters that describe or indicate a time in that either the frequency directly following from the time or one of its harmonics corresponds to an interference frequency. Individual, suitable test values, which lie within a value range that is permitted anyway, can therefore be purposefully found and checked. The test values, for which the limitation criterion is not fulfilled, are excluded from the adjustability.

This means in step S13 the user can then adjust only those values of the selected recording parameter which do not lead to an infringement of the limitation criterion.

It is understood that even in the case of the second exemplary embodiment, this can also be supplemented by the addition of further limitations, for example those that are described in subsequently published DE 10 2016 200 549.9.

Figure 5:
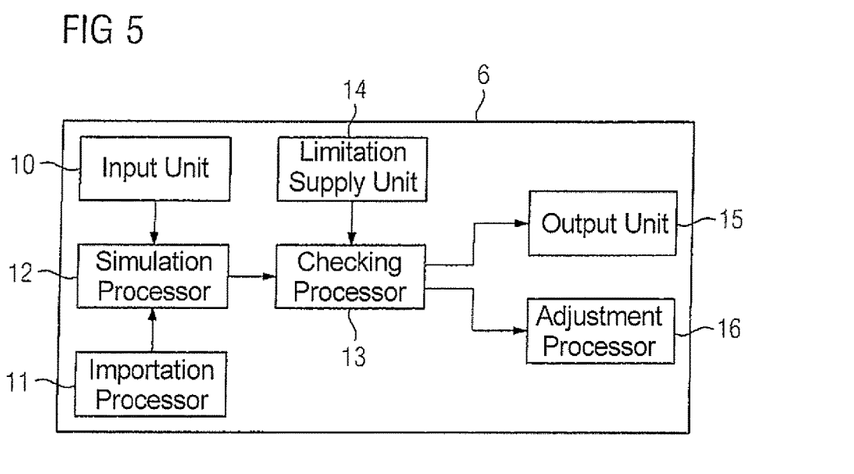
FIG. 5 shows one possible configuration of the controller of the magnetic resonance apparatus according to FIG. 1.

FIG. 5 shows, as an example, an illustration of one possible configuration of the controller 6, and this addresses the reference to the method illustrated here.

Recording parameters or values of recording parameters can be complied as a scanning protocol by an input unit 10 or importation processor 11 and can be supplied to the simulation processor 12 where the pre-calculation sequence is determined. The pre-calculation sequence is transferred to the checking processor 13 where the limitation criterion supplied by the limitation supply unit 14 can be fulfilled. Depending on how the process should continue, as a result an output unit 15 or an adjustment processor 16 can be controlled when the limitation criterion is not fulfilled.

The method described herein can also be in the form of stored program code that causes the method to be implemented by the controller 6 when the code is executed by the controller 6. An electronically readable data carrier has the code as electronically readable control information stored thereon.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:
   providing a control computer, that controls operation of an MR data acquisition scanner so as to record MR data from a subject, with a scanning protocol that is proposed for use in the operation of the MR data acquisition scanner, said scanning protocol comprising recording parameters that set components of said MR data acquisition scanner in a temporal sequence in order to record said MR data;
   in said control computer, specifying a limitation criterion that describes avoidance of excessive excitations in said MR data acquisition scanner that result in an interference frequency or in an interference frequency range of an interference spectrum;
   in said control computer, simulating at least a part of said temporal sequence of said scanning protocol, as a pre-calculated sequence;
   in said computer, checking said pre-calculated sequence as to whether said pre-calculated sequence satisfies said limitation criterion, in order to obtain a check outcome; and
   from said computer, generating an electronic signal that prevents use of said scanning protocol to acquire said MR data from the subject if said check outcome is that said pre-calculated sequence does not satisfy said limitation criterion.

2. A method as claimed in claim 1 wherein said scanning protocol comprises activation of gradient pulses emitted by gradient coils of said MR data acquisition scanner along physical gradient axes of said MR data acquisition scanner, and wherein said at least a part of said temporal sequence of said scanning protocol comprises the activation of said gradient pulses.

3. A method as claimed in claim 2 wherein said scanning protocol comprises multiple repetitions of said activation of said gradient pulses, and wherein said at least part of said scanning protocol comprises only one of said multiple repetitions of said activation of said gradient pulses.

4. A method as claimed in claim 1 comprising checking said pre-calculated sequence with respect to said limitation criterion by Fourier transforming said pre-calculated sequence in the frequency domain, and evaluating inputs to the interference spectrum in the frequency domain.

5. A method as claimed in claim 4 wherein said scanning protocol comprises multiple repetitions of said temporal sequence, and comprising repeatedly concatenating the pre-calculated sequence for said multiple repetitions, before Fourier transforming said pre-calculated sequence.

6. A method as claimed in claim 4 wherein said MR data acquisition scanner comprises a superconducting basic field magnet that is cooled by a coolant, and wherein specifying said limitation criterion comprises multiplying a mathematical representation of the frequency spectrum of the pre-calculated sequence that describes power inputs produced by said MR data acquisition scanner at different frequencies, with a mathematical representation of a heating response function for said coolant, in order to obtain a multiplication product, and integrating said multiplication product to produce an integral result, and comparing said integral result with a threshold value to obtain a comparison result, and using said comparison result as said limitation criterion.

7. A method as claimed in claim 4 comprising specifying said limitation criterion by identifying individual energy inputs, produced by said MR data acquisition scanner, at respective frequencies of said interference spectrum, and comparing said individual energy inputs with respective threshold values to obtain an overall comparison result, and using said overall comparison result as said limitation criterion.

8. A method as claimed in claim 1 comprising, at a display in communication with said control computer, presenting reference information describing non-satisfaction of said limitation criterion, if said check outcome is that said pre-calculated sequence does not satisfy limitation criterion.

9. A method as claimed in claim 8 comprising, in said computer, if said check outcome is that said pre-calculated sequence does not satisfy limitation criterion, identifying at least one of said recording parameters that is responsible for said pre-calculated sequence not satisfying limitation criterion and, in said computer, executing at least one of a display of said at least one of said recording parameters in said reference information, and automatically adjusting said at least one of said recording parameters in order to cause said check outcome to be that the limitation criterion is satisfied.

10. A method as claimed in claim 9 wherein said at least one recording parameter is a time-specifying recording parameter, and identifying said time-specifying recording parameter by determining whether at least one nature number, divided by the time-specifying recording parameter, is within the interference spectrum, or corresponds to a return frequency for which a permissible excitation strength is exceeded.

11. A method as claimed in claim 9 comprising identifying said at least one recording parameter by successively assuming different values for each recording parameter until a recording parameter is discovered that, when changed, causes said check outcome to be that said limitation criterion is satisfied.

12. A method as claimed in claim 9 comprising checking, as candidate recording parameters for said at least one parameter that is responsible for said check outcome being that said limitation criterion is not satisfied, recording parameters selected from the group consisting of echo time, repetition time, echo interval, slice number that determines an effective echo time, and number of concatenations of repetitions of said temporal sequence.

13. A method as claimed in claim 9 comprising, after said at least one recording parameter is identified that is responsible for said check outcome being that said limitation criterion is not satisfied, varying values of said at least one responsible recording parameter within a predetermined adjustment interval until said check outcome is that the limitation criterion is satisfied.

14. A method as claimed in claim 13 comprising, at a display in communication with said control computer, displaying a change notice identifying the value of the at least one responsible recording parameter that causes said check outcome to be that said limitation criterion is satisfied.

15. A method as claimed in claim 9 comprising, in said computer, designating at least one of said recording parameters as being unchangeable and, if said check outcome is that said limitation criterion is not satisfied, changing at least one other recording parameter that influences a strength of said excitations in said interference frequency until said check outcome is that said limitation criterion is satisfied.

16. A method as claimed in claim 1 comprising:
providing a user interface to said control computer that receives user entries of said recording parameters; and
in said computer, implementing at least said checking of said pre-calculation sequence to obtain said check outcome during the entry of said user entries.

17. A method as claimed in claim 16 comprising suppressing a user entry for a value of one of said recording parameters that results in said check outcome being that said limitation criterion is not satisfied.

18. A method as claimed in claim 17 comprising, in said computer, determining test values for recording parameters entered via said user interface as interference frequencies in said interference spectrum that result from excitations produced by respective test values.

19. A method as claimed in claim 1 comprising providing said control computer with said scanning protocol as at least one of a scanning protocol transmitted from another MR apparatus, other than an MR apparatus comprising said MR data acquisition scanner, or a scanning protocol already adjusted for orientation of gradients.

20. A method as claimed in claim 1 comprising, in said computer, also specifying at least one further limitation criterion that is not based on said interference spectrum.

21. A method as claimed in claim 20 wherein said at least one further limitation criterion comprises a status parameter that represents a status of said MR data acquisition scanner.

22. A method as claimed in claim 21 wherein said status is a temperature of said MR data acquisition scanner.

23. A magnetic resonance (MR) apparatus comprising:
an MR data acquisition scanner;

a control computer configured to control operation of said MR data acquisition scanner so as to record MR data from a subject, with a scanning protocol that is proposed for use in the operation of the MR data acquisition scanner, said scanning protocol comprising recording parameters that set components of said MR data acquisition scanner in a temporal sequence in order to record said MR data;

said control computer being configured to specify a limitation criterion that describes avoidance of excessive excitations in said MR data acquisition scanner that result in an interference frequency or in an interference frequency range of an interference spectrum;

said control computer being configured to simulate at least a part of said temporal sequence of said scanning protocol, as a pre-calculated sequence;

said computer being configured to check said pre-calculated sequence as to whether said pre-calculated sequence satisfies said limitation criterion, in order to obtain a check outcome; and said computer being configured to generate an electronic signal that prevents use of said scanning protocol to acquire said MR data from the subject if said check outcome is that said pre-calculated sequence does not satisfy said limitation criterion.

24. A non-transitory, computer-readable data storage medium encoded with programming instructions, said storage medium being loaded into a control computer of a magnetic resonance (MR) apparatus that comprises an MR data acquisition scanner, said programming instructions causing said control computer to:

control operation of said MR data acquisition scanner so as to record MR data from a subject, with a scanning protocol that is proposed for use in the operation of the MR data acquisition scanner, said scanning protocol comprising recording parameters that set components of said MR data acquisition scanner in a temporal sequence in order to record said MR data;

specify a limitation criterion that describes avoidance of excessive excitations in said MR data acquisition scanner that result in an interference frequency or in an interference frequency range of an interference spectrum;

simulate at least a part of said temporal sequence of said scanning protocol, as a pre-calculated sequence;

check said pre-calculated sequence as to whether said pre-calculated sequence satisfies said limitation criterion, in order to obtain a check outcome; and generate an electronic signal that prevents use of said scanning protocol to acquire said MR data from the subject if said check outcome is that said pre-calculated sequence does not satisfy said limitation criterion.

* * * * *